United States Patent
Kamgaing et al.

(10) Patent No.: US 8,759,950 B2
(45) Date of Patent: Jun. 24, 2014

(54) RADIO- AND ELECTROMAGNETIC INTERFERENCE THROUGH-SILICON VIAS FOR STACKED-DIE PACKAGES, AND METHODS OF MAKING SAME

(75) Inventors: Telesphor Kamgaing, Chandler, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 275 days.

(21) Appl. No.: 13/101,874

(22) Filed: May 5, 2011

(65) Prior Publication Data

US 2012/0280366 A1 Nov. 8, 2012

(51) Int. Cl.
*H01L 29/40* (2006.01)

(52) U.S. Cl.
USPC ............................ 257/621; 257/659; 257/660

(58) Field of Classification Search
USPC ......................................... 257/659, 660, 621
See application file for complete search history.

(56) References Cited

U.S. PATENT DOCUMENTS

2010/0078776 A1* 4/2010 Barth et al. .................... 257/659
2012/0258594 A1* 10/2012 Barth et al. .................... 438/667

* cited by examiner

*Primary Examiner* — Thien F Tran
(74) *Attorney, Agent, or Firm* — John N. Greaves (57) ABSTRACT

An apparatus includes a radio-frequency die with shielding through-silicon vias and a die backside lattice lid that shield a sector in the RF die from radio- and electromagnetic interference.

11 Claims, 7 Drawing Sheets

RADIO- AND ELECTROMAGNETIC INTERFERENCE THROUGH-SILICON VIAS FOR STACKED-DIE PACKAGES, AND METHODS OF MAKING SAME

RELATED APPLICATIONS

This disclosure is related to U.S. patent application Ser. Nos. 13/101,883 and 13/101,891 filed on even date herewith, the disclosures of which are incorporated herein by specific reference.

TECHNICAL FIELD

Disclosed embodiments relate to packaged radio-frequency integrated circuits and methods of forming them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Processes are disclosed where through-silicon-via radio-frequency integrated circuit (TSV RFIC) dice are configured with shielding TSVs in the dice that form shielded sectors to protect sensitive circuits.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1A:
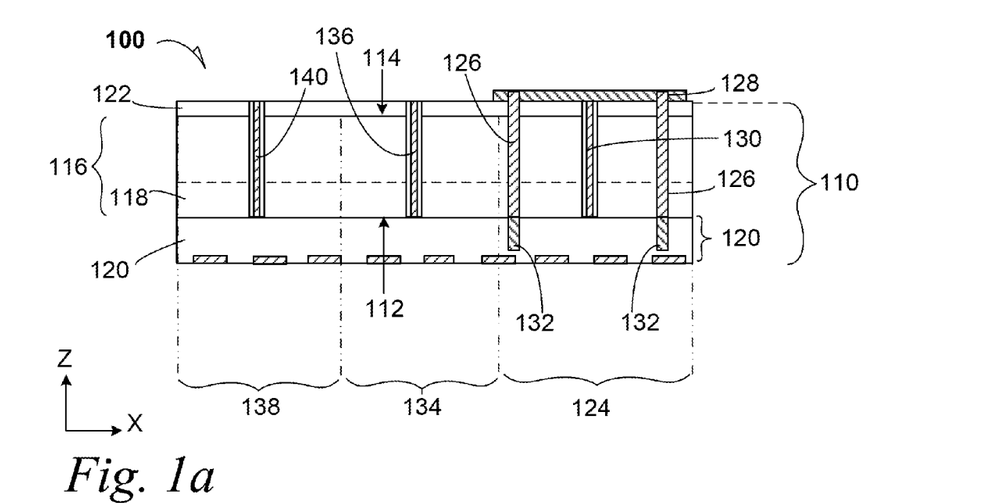
FIG. 1a is a cross-section elevation of a microelectronic apparatus that includes a through-silicon via shielded sector according to an example embodiment.

FIG. 1a is a cross-section cut-away elevation of a microelectronic apparatus 100 that includes a through-silicon via shielded sector according to an example embodiment. A radio-frequency (RF) die 110 includes an active surface 112 and a backside surface 114 that is coplanar to the active surface 112. The RF die 110 may also be referred to as an RFIC die 110, although the RF die 110 may have several different RFICs and other integrated circuits contained within the RF die 110. The RF die 110 is made of bulk semiconductive material 116 that may be a doped silicon material. In an embodiment, the bulk semiconductive material 116 is made of a doped gallium arsenide material. In an embodiment, the bulk semiconductive material 116 is configured as a PMOS device. In an embodiment, the bulk semiconductive material 116 is configured as an NMOS device. Other materials and configurations may be selected for the bulk semiconductive material 116.

A circuitry layer 118 is included at the active surface 112 of the bulk semiconductive material 116 and it has been front-end processed to achieve integrated circuits including active and passive devices in the circuitry layer 118. The circuitry layer 118 is disposed adjacent to- and includes the active surface 112 of the RF die 110. A back-end-processed metallization 120 (back-end metallization 120) is disposed adjacent and upon the active surface 112. The back-end metallization 120 may have several layers of metallization such as from metal-1 (M1) up to any of M2 to M12 or higher depending up a useful application of the several disclosed embodiments. In an embodiment, the backside surface 114 is blanket covered with a backside metal film 122.

A first sector 124 of the RF die 110 is partitioned. In an embodiment, the first sector 124 includes circuitry in the circuitry layer 118 such as global-positioning system (GPS) circuitry. In any event, the circuitry disposed in the first sector 124 may be referred to as an RFIC GPS sector 124. The first sector 124 may be affected by neighboring radio- and electromagnetic (RMI) interference such as switching noise and other noise that may be generated elsewhere in the RF die 110 or from neighboring devices. Consequently, the first sector 124 is configured with at least one radio- and electromagnetic interference shielding structure that includes an enclosure and a lid.

Figure 2:
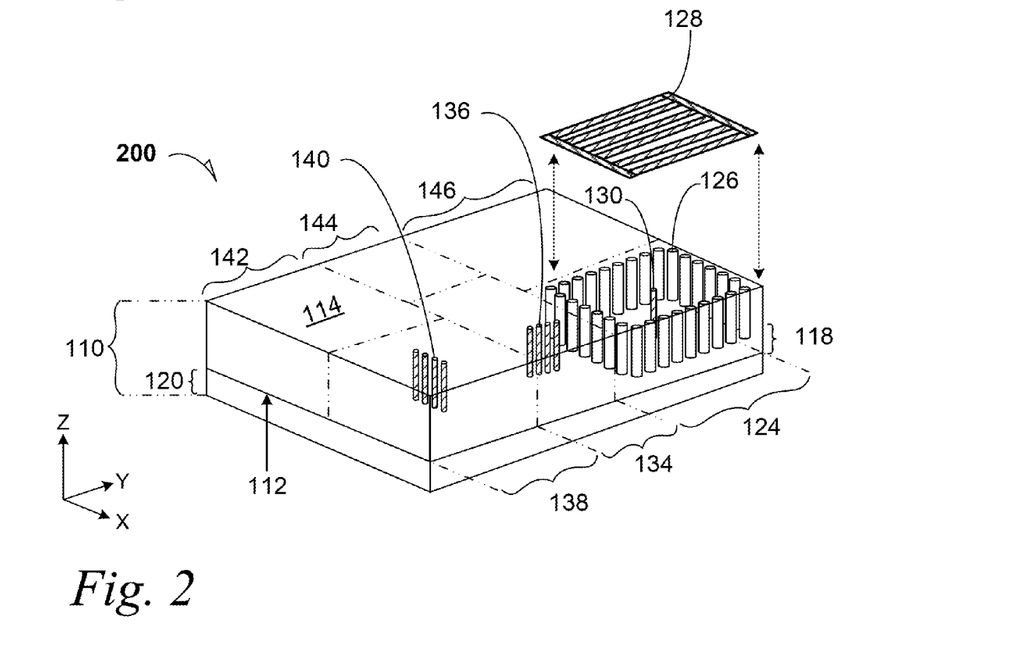
FIG. 2 is a partially exploded, perspective wireframe cut-away elevation of the RF die depicted in FIG. 1a according to an example embodiment.

In an embodiment, a plurality of shielding through-silicon vias (shielding TSVs) 126 forms a three-dimensional (3D) radio- and electromagnetic interference first shield around a perimeter of the GPS circuitry in the first sector 124. The 3D structure 126 is seen taking up both X- and Z-directions, but it also forms a closed perimeter when depicted to include an X-Y view as shown in FIG. 2. The shielding TSVs 126 forms the enclosure. In an embodiment, the first sector 124 is also backside shielded by a backside shield 128. The backside shield may be patterned in order to provide useful radio- and electromagnetic noise shielding for the first sector 124. In an embodiment, the backside shield 128 is matching the perimeter formed by the shielding TSVs 126. The matching result means the X-Y perimeter of the shielding TSVs 126 is substantially equal in footprint to the X-Y footprint of the backside shield. The backside shield 128 is a lattice structure that forms the lid. The lid 128 is elevated from the enclosure 126 for illustrative purposes, but it aligns as indicated by the dashed directional arrows. The backside shield 128 is further illustrated in FIG. 2. Although the backside shield 128 is shown only to cover the perimeter of the shielding TSVs 126, it may extend the length and breadth of the RF die 110 on the die backside 114.

Electrical communication, whether signal, power, or ground, may be carried out through at least one first TSV 130 that is disposed in the first sector 124. A TSV that functions as signal, power, or ground connections may be referred to herein as "signal TSV" in contrast to a TSV that functions as a shielding TSV. It may be understood that several first TSVs 130 may be located in the first sector 124 that are configured for one of signal and power/ground functions and they are therefore not part of the enclosure made up of shielding TSVs 126. The first TSVs 130 are coordinated in X-Y orientation to pass through spacing (Z-direction) in the lattice of the backside shield 128. In FIG. 1a, the backside shield 128 is offset from the first TSV 130 such that the first TSV 130 may pass through interstices in the backside shield lattice.

It may now be understood that a shielded sector may include a single circuit or a number of circuits that are a subset of an entire device such as GPS circuitry. In an embodiment, design rules for forming a microelectronic apparatus such as the microelectronic apparatus 100 may favor forming a shielded sector around a subset of the total circuitry for a given device such as a GPS in the first sector 124. Consequently, there may be a first shielded sector that protects a subset of the total circuitry of a GPS in the first sector 124. In an embodiment, there is a first shielded sector that protects all- or a subset of the total circuitry of a GPS in the first sector, a second shielded sector that protects a subset of the total circuitry of an $N^{th}$ G device in the second sector 134. Similarly, there may be a subsequent shielded sector in the subsequent sector 138 with all- or a subset of circuits protected by the subsequent shielded sector.

In an embodiment, electrical shielding in the first sector 124 is extended into the back-end metallization 120 with shielding through-metallization vias (TMVs), two of which are indicated with the reference numeral 132. As illustrated, the enclosure that makes up the TSV enclosure has the same perimeter as that formed by the shielding TMVs. It can be seen that an extension of the enclosure 126 is formed with the TMVs 132 such that the enclosure is deeper (in the Z-direction) than just the depth (Z-direction) of the bulk semiconductive material 116. It may be understood whereas the shielding TSVs 126 form vertical (Z-direction) oriented structures, the TMVs 132 may include a combination of traces in the X-Y orientation as well as interconnect vias in the Z-direction.

In an embodiment, the shielding TMV 132 extends the depth of the enclosure 126 in the Z-direction by a factor from about 1.01 to about 1.50. In an embodiment where the metallization 120 has multiple layers such as M1 to $Mn^{th}$ where n is from 2 to 12 or greater, the shielding TMVs 132 extend to a level less than n. This allows for metallization wiring to exit the footprint of the enclosure 126 and to move laterally (X- and Y directions) to other back-end metallization that couples to other sectors on the RF die 110. For an example embodiment, the shielding TMVs 132 extend only to M4 in an M12 back-end metallization 120.

In an embodiment, a second sector 134 is partitioned in the RF die 110 and the second sector 134 also has RF capabilities. In an embodiment where the first sector 124 contains circuitry for a GPS capability, the second sector 130 includes a different RF capability. For example, the second sector 130 may have a smart-phone RF capability such as 2G, 3G, 4G, or a newer non-equivalent "$N^{th}$ G" development where the first sector 124 contains the GPS capability. In an embodiment, the first sector 124 has GPS circuitry and the second sector 130 has 4G circuitry.

Electrical communication, whether signal, power, or ground, may be carried out through at least one second TSV 136 that is disposed in the second sector 134. It may be understood that several second TSVs 136 may be located in the second sector 134. In an embodiment, the at least one TSV 136 is formed in a thin layer of insulating material 137.

In an embodiment, a subsequent sector 138 is partitioned in the RF die 110. The subsequent sector 138 also has RF capabilities that are in addition to- and different from that in the first sector 124. In an embodiment where the first sector 124 contains circuitry for a GPS capability, the subsequent sector 132 contains an RF capability that is different from those in the first sector 124 and the second sector 134. In an example embodiment, the subsequent sector 132 may have a WiFi capability. In an embodiment where the first sector 124 contains circuitry for a GPS capability, and the second sector 134 contains circuitry for a 2G, 3G, 4G, or $N^{th}$ G capability, the subsequent sector 138 contains circuitry for a WiFi capability.

Electrical communication, whether signal, power, or ground, may be carried out through at least one subsequent TSV 140 that is disposed in the subsequent sector 138. It may be understood that several subsequent TSVs 140 may be located in the subsequent sector 138. In an embodiment, the at least one subsequent TSV 140 is formed in a thin layer of insulating material 141. Although the shielding TSVs 126 are depicted without an insulating material, it may be understood that all TSVs may be fabricated with an insulating material to facilitate low-leakage of signal or power to the semiconductive material.

FIG. 2 is a partially exploded, perspective wireframe cut-away elevation 200 of the RF die 110 depicted in FIG. 1a according to an example embodiment. The backside surface 114 is depicted opposite the active surface 112, which is covered by the back-end metallization 120.

The RF die 110 exhibits the first sector 124 with the radio- and electromagnetic interference shielding structure that includes the enclosure 126 and the lid 128. It can be seen that the backside shield 128 is matching the perimeter formed by the shielding TSVs 126. Although a single first TSV 130 is depicted within the radio- and electromagnetic interference shielding structure, it may be understood that several first TSVs may be located within the shielding structure and couple the circuitry of the circuitry layer 118 in the first sector 124 to connections at the backside surface 114.

The RF die 110 exhibits the second sector 134 adjacent the first sector 124. A plurality of second TSVs 136 is depicted within the second sector 134. Although four second TSVs 136 are depicted within the second sector, it is understood that several second TSVs may be located within the circuitry layer 118 in the first sector 134 to connections at the backside surface 114.

The RF die 110 exhibits the subsequent sector 138 adjacent the second sector 134. A plurality of subsequent TSVs 140 is depicted within the subsequent sector 138. Although four subsequent TSVs 140 are depicted within the subsequent sector 138, it is understood that several subsequent TSVs may be located within the circuitry layer 118 in the subsequent sector 138 to connections at the backside surface 114. The plurality of subsequent TSVs 140 are aligned along an X-direction, whereas the plurality of second TSV 136 are aligned along a Y-direction. The different alignments are illustrative that TSVs regardless of sector location may be aligned in either direction or they may be mixed in an X-Y layout.

Other sectors are depicted within the RF die in arbitrary fashion including a third sector 142, a fourth sector 144, and a fifth sector 146. The other sectors are illustrative of a microelectronic apparatus fabricated in a die such as a through-silicon via radio-frequency integrated circuit (TSV RFIC) 200.

In an example embodiment, a shielding TSV enclosure such as the shielding TSVs 126 depicted in FIG. 2 may encompass more than one region. For example, at least part of a GPS circuit and a WiFi circuit may be encompassed by the shielding TSV enclosure. In an embodiment, the several sectors include a shielded GPS sector 124, an $N^{th}G$ sector 134, a WiFi sector 138, a CPU sector 142, a Bluetooth® sector 144, and other sectors 146. The other sectors 146 may include clock, SC, VED and VEC, audio, display, GFX, and other non-equivalent but useful circuits.

Figures 3, 4:
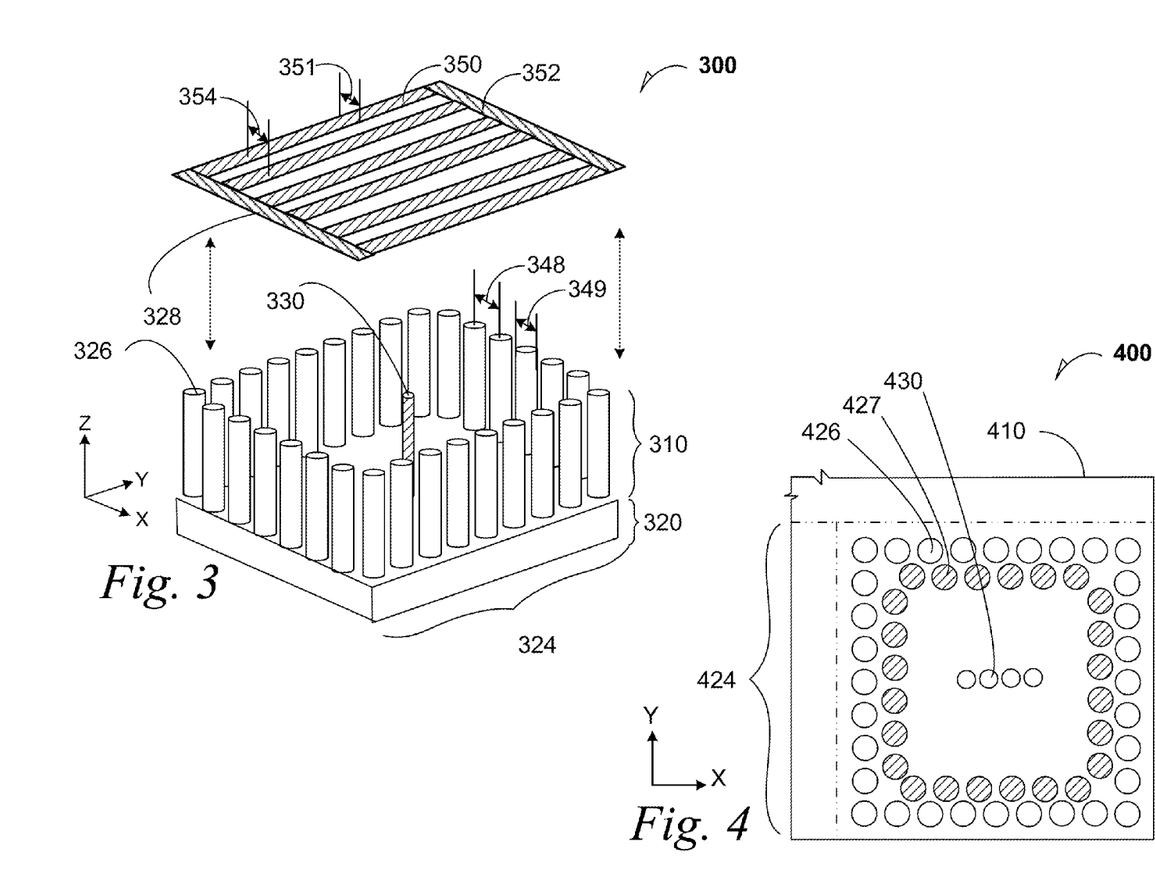
FIG. 3 is an exploded detail perspective cut-away of a radio- and electromagnetic interference shielding structure according to an example embodiment.
FIG. 4 is a top plan of a portion of a radio- and electromagnetic interference shielding structure according to an example embodiment.

FIG. 3 is an exploded detail perspective cut-away of a radio- and electromagnetic interference shielding structure 300 according to an example embodiment. The shielding structure 300 is embedded in a semiconductive substrate 310, which is indicated to take up space above (Z-direction) a back-end metallization 320. At least one signal or power TSV 330 is disposed within the sector 324 of the semiconductive substrate 310 depicted.

In an embodiment, spacing 348 between adjacent shielding TSVs 326 is calculated to cause useful shielding of RF noise being generated within the semiconductive substrate 310 and in neighboring devices. In an embodiment, center-to-center pitch spacing 348 is equal one-tenth the wavelength of neighboring radio- or electromagnetic noise, or $\lambda/10$. In an embodiment, center-to-center pitch spacing 348 is in a range from $\lambda/20$ to $\lambda/1$. In an embodiment where center-to-center pitch spacing is in a range where each shielding TSV 326 is a diameter 349, of d, and two adjacent shielding TSVs 326 are pitched by a pitch spacing 348 from 1.1 d to 3 d. In an embodiment, the pitch spacing 348 is 2 d. In an embodiment where the shielding TSV 326 is a diameter, d, any two adjacent shielding TSVs 326 are center-to-center pitch spaced by a pitch spacing 348 of 2 d. In an embodiment, each shielding TSV 326 has a diameter 349 of 8 µm and the pitch, d, and two adjacent shielding TSVs 326 are pitch spaced by a pitch spacing 348 of 16 µm.

The backside shield 328 is depicted exploded above the shielding TSVs 326. The lid 328 is elevated from the enclosure 326 for illustrative purposes, but it aligns as indicated by the dashed directional arrows. The backside shield 328 forms the lattice lid to the enclosure that is the shielding TSVs 326. As depicted, a plurality of traces 350 is depicted running in the Y-direction between two headers 352 that run in the X-direction. Trace width and trace spacing of the lattice that forms the lid 328 may be analogous to shielding TSV diameter and center-to-center spacing. Consequently in an embodiment, where any two adjacent shielding TSVs 326 have a diameter of d and are center-to-center pitched by a distance of 2 d, any two adjacent traces 350 have a width, w, 351 (X-direction) equal to d and are center-to-center spaced by a distance of 2 d. In an embodiment, the backside shield 328 is patterned and etched such as by photolithographical techniques.

Together, the backside shield 328 and the TSVs 326 make up a radio- and electromagnetic interference shielding structure. In an embodiment shielding TMVs such as the shielding TMVs 132 depicted in FIG. 1a are added to eke out a useful larger radio- and electromagnetic interference shielding structure.

It may now be understood that the number of TSVs may be about 30,000 for a given RFIC die embodiment, whether they act as shielding TSVs or they act as power, ground, or signal TSVs. Consequently, where the area of the first sector 324 is known, where the particular wavelength, $\lambda$, is known that is being shielded against, and where a given center-to-center spacing of shielding TSVs is based upon a useful relationship such as $\lambda/10$, the number of shielding TSVs found in the first sector 324 will be known for a single-row shielding TSV configuration. Consequently, a TSV shielded sector may also be defined by an approximate number of shielding TSVs.

FIG. 4 is a top plan of a portion of a radio- and electromagnetic interference shielding structure 400 according to an example embodiment. The shielding structure 400 is embedded in a semiconductive substrate 410, which is indicated to take up space within a first sector 424. At least one signal or power or ground TSV 430 is disposed within the first sector 424 of the semiconductive substrate 410.

A first plurality of shielding TSVs 426 forms a 3D radio- and electromagnetic interference first shield around a perimeter of the GPS circuitry in the first sector 424. In an embodiment, a subsequent plurality of shielding TSVs 427 forms a 3D radio- and electromagnetic interference subsequent shield that is concentric to the first shield. It may be understood that a second plurality of shielding TSVs may be provided in addition to the first- and subsequent plurality of shielding TSVs 426 and 427, respectively. The number of pluralities of shielding TSVs may range from two (as depicted in FIG. 4) to 100.

In an embodiment, spacing between adjacent first shielding TSVs 426 is calculated to cause useful shielding of RF noise being generated within the semiconductive substrate 410 and in neighboring devices. Similarly, spacing between adjacent subsequent shielding TSVs 427 is calculated to cause useful shielding of RF noise being generated within the semiconductive substrate 410 and in neighboring devices. It may now be understood that a combination of at least two concentric 3D shields (and a lid) may be used to achieve a useful radio- and shielded sector. With a given combination, any or all of center-to-center pitch, shielding TSV diameter, and X-Y staggering between two concentric enclosures may be employed to achieve a useful composite radio- and electromagnetic interference shield.

It may now be understood that the number of TSVs may be about 30,000 for a given RFIC die embodiment, whether they act as shielding TSVs or they act as power, ground, or signal TSVs. Consequently, where the area of the first sector 424 is known, where the particular wavelength, $\lambda$, is known that is being shielded against, and where a given center-to-center spacing of shielding TSVs is based upon a useful relationship such as $\lambda/10$, the number of shielding TSVs found in the first sector 424 will be known for a configuration of multiple-plurality shielding TSVs. The center-to-center pitch may be larger, however, where multiple rows are configured such as the first- and subsequent plurality of shielding TSVs 426 and 427. For example where the subsequent plurality of shielding TSVs 427 is staggered to fill gaps between the first plurality of shielding TSVs 426, the center-to-center pitch in a given row may be larger because center-to-center pitch of any first TSV 426 and an adjacent subsequent TSV 427 may still be a distance such as $\lambda/10$.

Figure 1B:
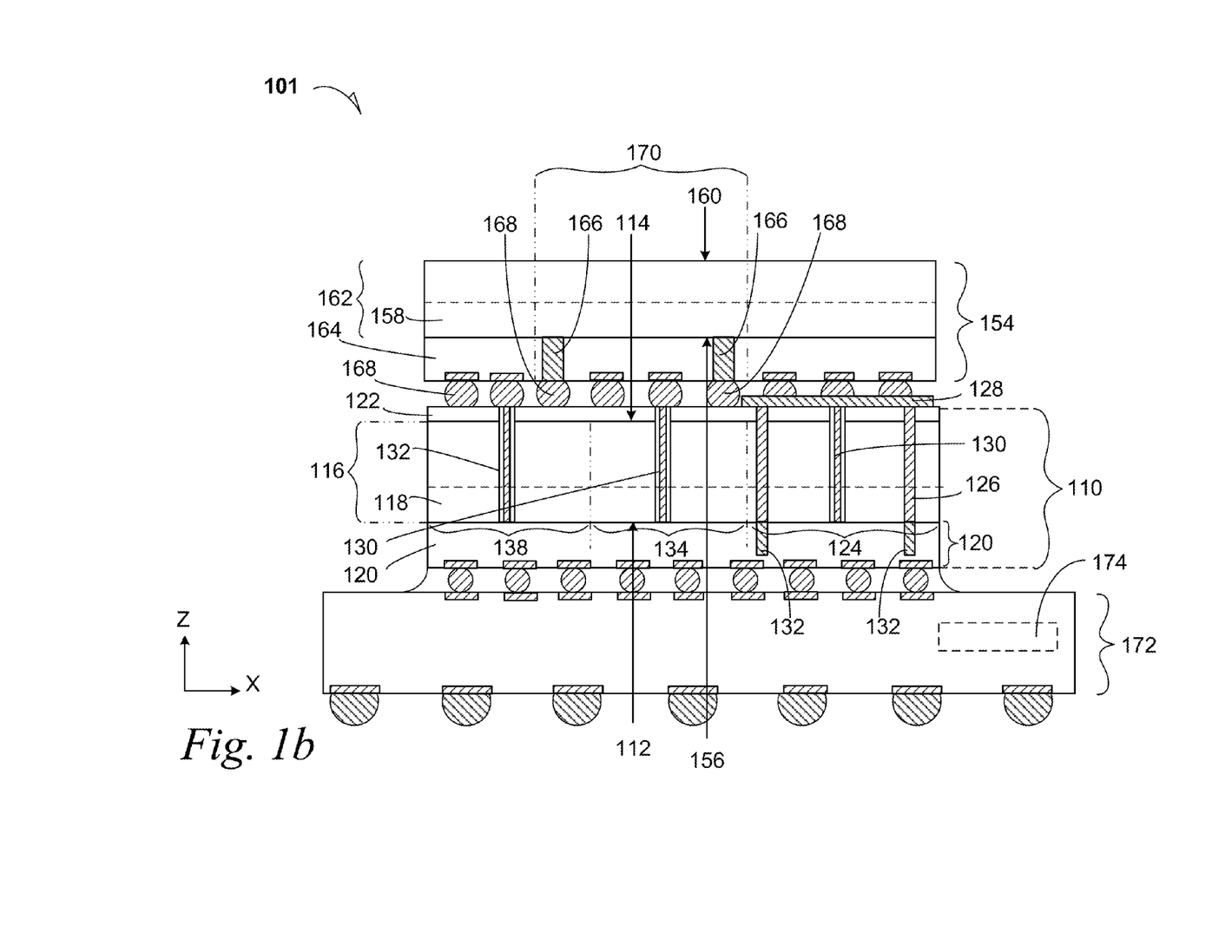
FIG. 1b is a cross-section elevation of a chip package that includes the microelectronic apparatus depicted in FIG. 1a after further processing according to an example embodiment.

FIG. 1b is a cross-section elevation of a chip package 101 that includes the chip apparatus 100 depicted in FIG. 1a after further processing according to an example embodiment. The chip package 101 includes the RF die 110, a subsequent die 154 such as a digital processor (DP) die, and a mounting substrate 172 such as a level 1 interconnect. In an embodiment, the subsequent die 154 is a memory die 154. In an embodiment, the subsequent die 154 is a stack of a plurality of memory dice 154. In an embodiment, the mounting substrate 172 is a direct-chip-attach (DCA) board 172. In an embodiment, the DP die 154 may be a TSV DP die (see FIG. 1c).

The RF die 110 includes the through-silicon via shielded sector 124 according to an example embodiment. The RF die 110 is depicted with the active surface 112 and the backside surface 114 that is coplanar to the active surface 112. The circuitry layer 118 has been front-end processed and is adjacent the bulk semiconductive material 116. The circuitry layer 118 is disposed adjacent to—and includes the active surface 112 of the RF die 110. The back-end-processed metallization 120 is disposed adjacent and upon the active surface 112. Along with the first sector 124 of the RF die 110, the second- and subsequent sectors 134 and 138 are depicted, respectively. Electrical communication, whether signal, power, or ground, may be carried out through the at least one first TSV 130 that is disposed in the first sector 124. Where useful, the shielding TMVs 132 may be employed.

In an embodiment, the subsequent die 154 is coupled to the RF die 110 through at least the first TSVs 130 that communicate out of the radio- and electromagnetic interference shielding structure that includes an enclosure 126 embodiment and a lid 128 embodiment. The subsequent die 154 is depicted as a flip-chip die 154 with an active surface 156 and a backside surface 160. A circuitry layer 158 within bulk silicon 162 and is also part of the active surface 156. The active surface 156 is also in contact with a back-end metallization 164 through which the RF die 110 communicates to the subsequent die 154.

As depicted, the RF die 110 has the TSV enclosure 126 and the lid 128 to form a shielded first sector 124. With the subsequent die 154, a radio- and electromagnetic interference-generating sector 170 is shielded by a ground ring 166 that is in the back-end metallization 164. The shielding is continued with a bump ring 168 that shares the same X-Y perimeter as the ground ring 166. For example, where the subsequent die 154 is a digital processor, the radio- and electromagnetic interference-generating sector 170 may have a noise source such as a clock signal. The ground ring 166 and the bump ring 168 are useful to contain the radio- and electromagnetic interference to the sector 170. Consequently where it is useful to shield the first sector 124 from neighboring radio- and electromagnetic interference, and where the offending radio- and electromagnetic interference is being generated in a nearby sector 170 of a nearby device 154, the RMI may be effectively restrained by use of the ground ring 166 and the bump ring 168. It may now be appreciated that spacing of at least the ground ring 166 may follow a useful formula such as the offending radio signal wavelength, divided by a useful number such as 10.

In an embodiment, the RF die 110 is flip-chip mounted on a mounting substrate 172 that is a first-level interconnect 172 such as a DCA board. As depicted a passive device 174 is embedded in the mounting substrate 172. In an embodiment, the mounting substrate 172 is a coreless substrate 172 that includes at least one passive device 174 embedded therein. Electrical communication between the RF die 110 and the passive device 174 is carried out through electrical bumps according to any disclosed embodiment or otherwise according to known technique. As illustrated, the RF die 110 is mated to the mounting substrate 172 by use of electrical bumps according to any disclosed embodiment or otherwise according to known technique. Other passive devices may be embedded in the mounting substrate 172 according to any technique disclosed in PCT Patent Application No. PCT/US2010/061388, filed Dec. 20, 2010 by the named inventors in this instant disclosure, the disclosure of which is incorporated herein in its entirety by reference.

Figure 1C:
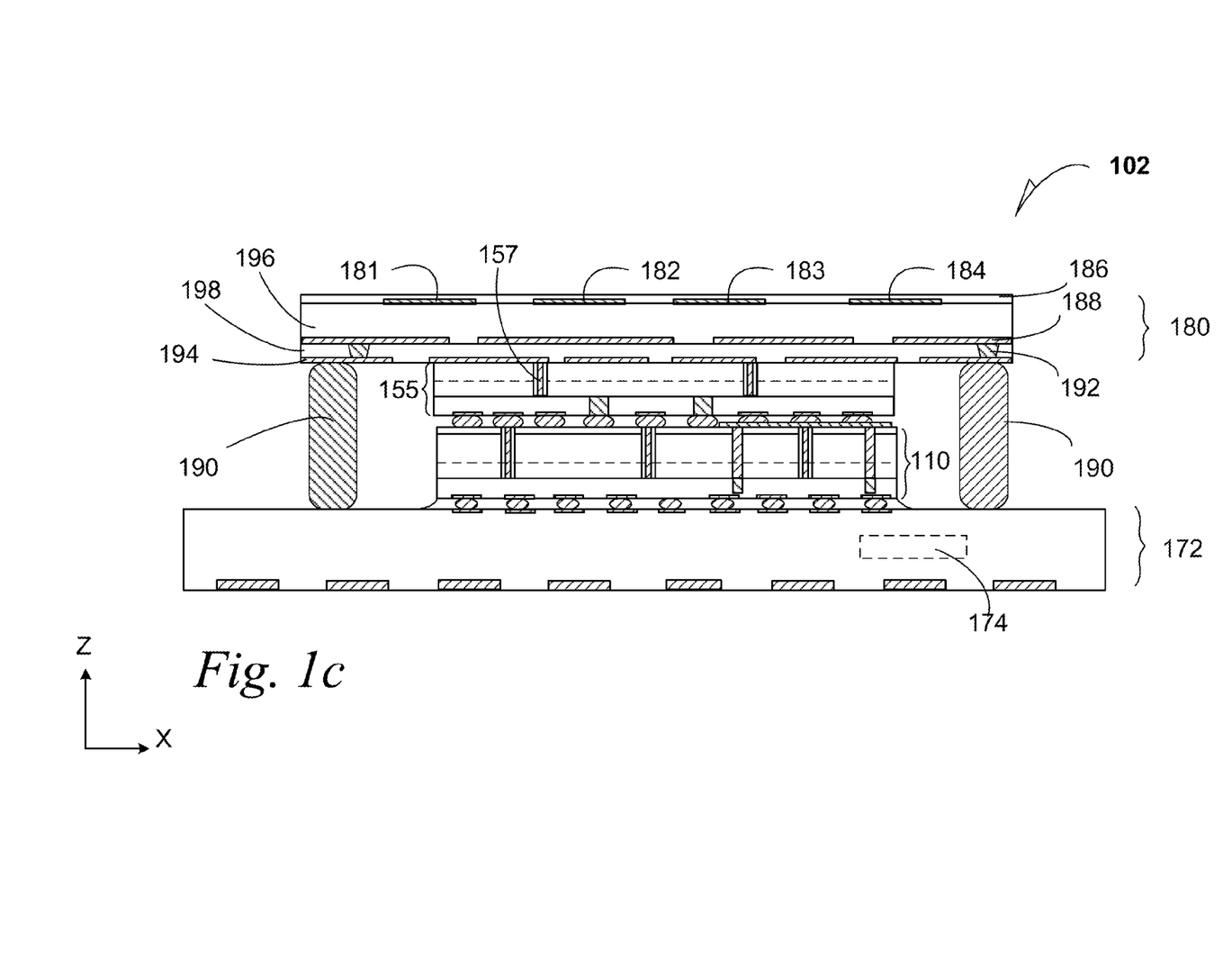
FIG. 1c is a cross-section elevation of a chip package that includes the microelectronic apparatus depicted in FIG. 1a with a through-silicon via digital processor and after further processing according to an example embodiment.

FIG. 1c is a cross-section elevation of a chip package 102 that includes a microelectronic chip apparatus depicted in FIG. 1a with a variation of a through-silicon via digital processor 155 according to an example embodiment. In an embodiment, the space designated by item 155 is occupied by a memory die. In an embodiment, the space designated by item 155 is occupied by a stack of a plurality of memory dice. In an embodiment, the space designated by item 155 is a DP die and at least one memory die stacked therewith.

The chip package 102 includes the RF die 110, a TSV subsequent DP die 155, a mounting substrate 168, and a phased-array antenna substrate 180. In an embodiment, the mounting substrate 168 is a direct-chip-attach (DCA) board 168. The TSV subsequent die 155 is coupled to a phased-array antenna (PAA) substrate 180 though the TSV DP subsequent die 155 and to the RF die 110.

The PAA substrate 180 is illustrated with four occurrences of planar antenna elements 181, 182, 183, and 184 that are exposed through an array mask 186. In an embodiment, a metallic layer 188 with apertures is disposed in the PAA substrate 180 as a ground plane to enhance antenna bandwidth. The ground plane 188 is coupled to the dummy bumps 190 through ground vias 192 in the PAA substrate 180.

Electrical contact between the RF die 110 and the antenna elements is accomplished through at least one trace 194. Electrical coupling of the antenna elements 181, 182, 183, and 184 through the PAA substrate 180 is accomplished by aperture feeding of an inductive coupling. In an embodiment, the PAA substrate 180 includes a first dielectric layer 196 and a second dielectric layer 198. In an embodiment, the first dielectric layer 196 is glass and has a lower dielectric constant than the second dielectric layer 198 which is also glass.

The RF die 110 is coupled to the PAA substrate 180 through at least one TSV 157 and to the at least one trace 194. In an embodiment, the RF die 110 TSV signals are transmitted to the phased-array antenna elements, but lower frequency functions are separated from the PAA substrate 180 and contained in the mounting substrate 172. This integration system reduces signal congestion and facilitates a smaller X-Y form factor that is limited by dimensions of the PAA substrate 180.

Figure 5:
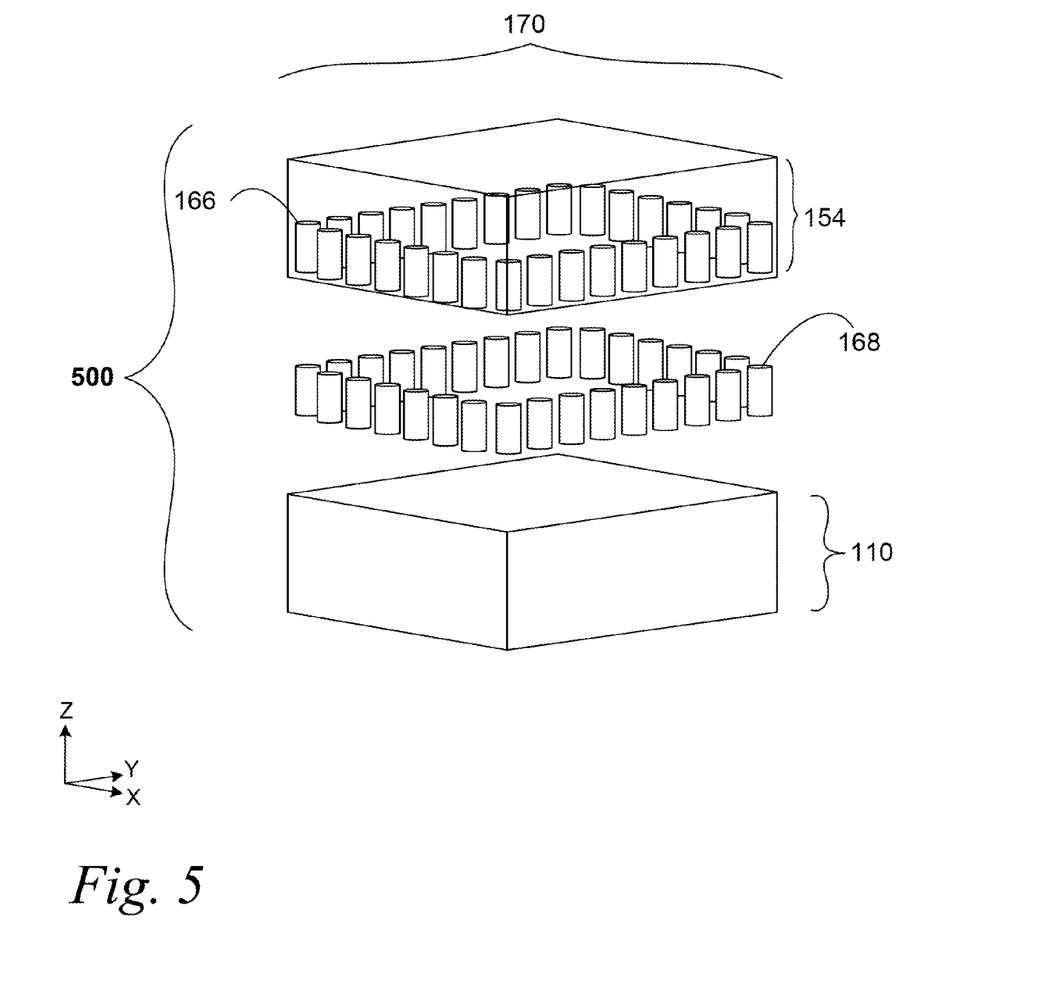
FIG. 5 is an exploded cut-away elevation perspective of portions of the chip package depicted in FIG. 1b according to an example embodiment.

FIG. 5 is an exploded cut-away elevation perspective view of portions of the chip package 101 depicted in FIG. 1b according to an example embodiment. Only the Z-direction footprint of the subsequent die 154 is depicted in FIG. 5 with respect to the sector 170. The subsequent die 154 is depicted in wireframe within the sector 170 and the bump ring 168 that is disposed between the subsequent die 154 and the RF die 110 is exploded in the Z-direction away from both the subsequent die 154 and the RF die 110. It can be seen that a shielding structure is formed with the ground ring 166 and the bump ring 168 to restrict radio- and electromagnetic interference to within the sector 170.

Figure 6:
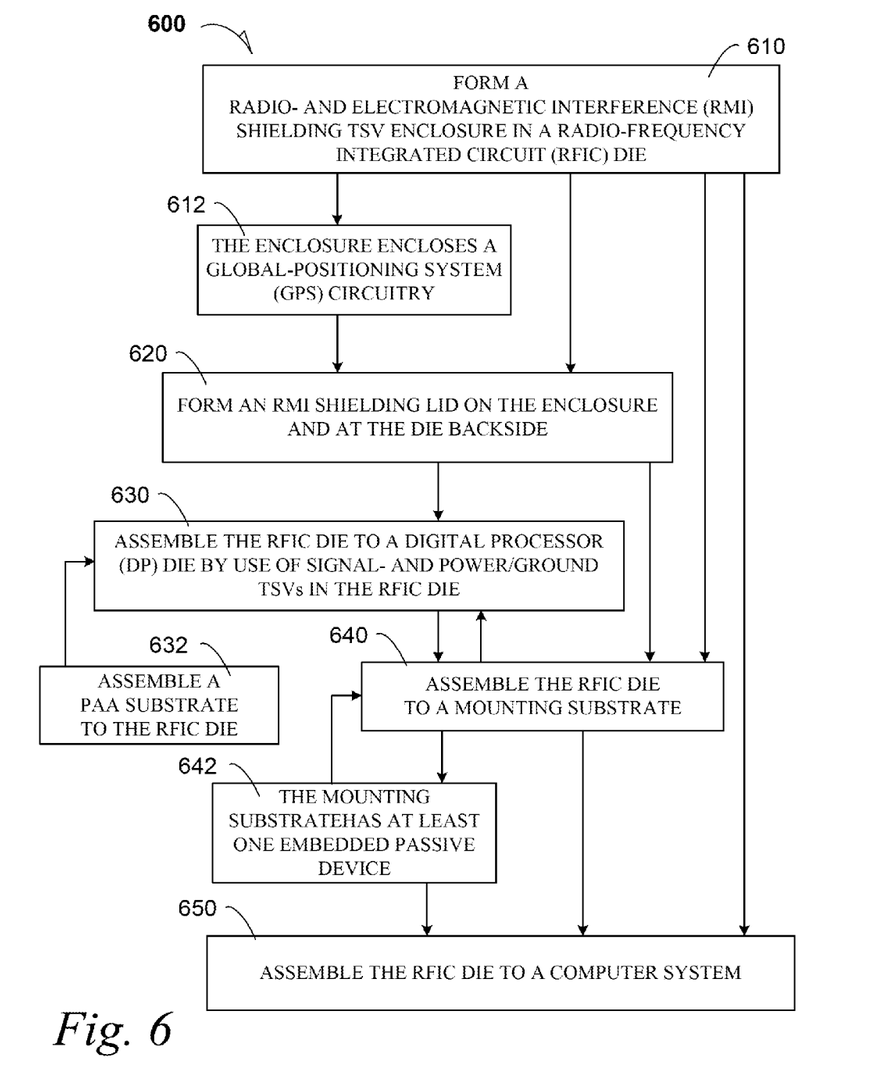
FIG. 6 is a process and method flow diagram according to an example embodiment.

FIG. 6 is a process and method flow diagram 600 according to an example embodiment.

At 610, a process embodiment includes forming a radio- and electromagnetic interference shielding TSV enclosure in an RF die. In a non-limiting example embodiment, the RMI TSV enclosure 126 is formed in the RF die 110 depicted in FIG. 1a. Formation of the TSVs to for the RMI TSV enclosure 126 may be done by known technique. In a non-limiting example embodiment, the back-end metallization 120 contains a through-metallization shielding via 132.

At 612, the enclosure encloses a GPS circuitry. In a non-limiting example embodiment, the first sector 124 depicted in FIG. 1b is enclosed in the RMI TSV enclosure 126.

At 620, the process includes forming an RMI shielding lid on the enclosure at the die backside. In a non-limiting example embodiment, the lid 128 is formed with useful trace width and spacing as depicted in FIG. 2. In an example embodiment, the process commences at 610 and terminates at 620.

At 630, a method embodiment includes assembling the RFIC die to a digital processor by use of signal- and power/ground TSVs that are in the RFIC die. In a non-limiting example embodiment, the subsequent die 154, which is a DP die 154 is flip-chip assembled to the RF die 110 as depicted in FIG. 1b. In an embodiment, the method commences at 610 and terminates at 630.

At 632, the method includes assembling a phased-array antenna substrate to the RF die. In a non-limiting example embodiment, the PAA substrate 180 is assembled to the RF die 110 as depicted in FIG. 1c. It is understood that any embodiment of the PAA substrate may be assembled to a TSV RF die, and the several PAA substrate embodiments disclosed RELATED APPLICATIONS and filed on even date with the instant patent disclosure.

At 640, a method embodiment includes assembling the RFIC die to a mounting substrate. In a non-limiting example embodiment, the RF die 110 is assembled to the board 172 as seen in FIG. 1b. In a non-limiting example embodiment, an RF die 110 embodiment is assembled directly to a board as seen with processes 610 and 620 along with method 640. Other assembly may be done incidental or subsequent to processes 610 and 620 along with method 640 such as a second entity assembles a subsequent die to the RF die.

At 642 a method embodiment includes the mounting substrate with at least one passive device embedded therein. In a non-limiting example embodiment, an inductor 174 that supports the RF die 110 is embedded in the mounting substrate 172 and is coupled by the flip-chip connections between the board 172 and the RF die 110.

At 650, a method embodiment includes assembling the RF die to a computer system. In a non-limiting example embodiment, the computer system 700 depicted in FIG. 7 includes an RF die embodiment that has been assembled to make up the computer system 700.

Figure 7:
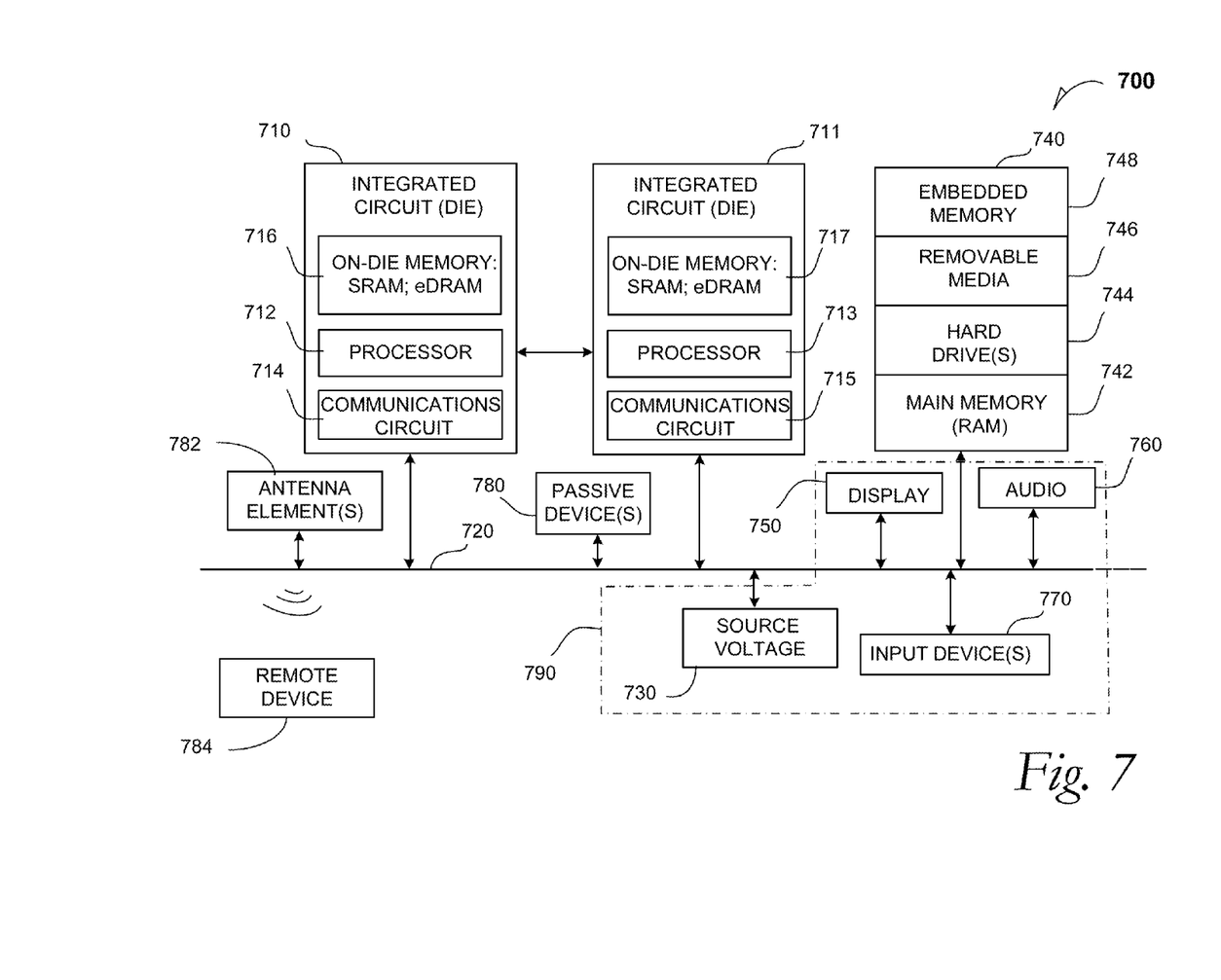
FIG. 7 is a schematic of a computer system according to an embodiment.

FIG. 7 is a schematic of a computer system according to an embodiment.

The computer system 700 (also referred to as the electronic system 700) as depicted can embody an apparatus that includes an RF die with a radio- and electromagnetic interference shielding structure according to any of the several disclosed embodiments and their equivalents as set forth in this disclosure. An apparatus that includes an RMI shielding structure embodiment is assembled to a computer system. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be integral to an automobile. The computer system 700 may be integral to a television.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type of an apparatus that includes an RMI shielding structure embodiment. As used herein, the processor 712 may mean any type of circuit such as, but not limited to, a microprocessor, a microcontroller, a graphics processor, a digital signal processor, or another processor. In an embodiment, the processor 712 is the RMI shielding structure embodiment disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems. In an embodiment, the processor 710 includes on-die memory 716 such as static random-access memory (SRAM). In an embodiment, the processor 710 includes embedded on-die memory 716 such as embedded dynamic random-access memory (eDRAM).

In an embodiment, the integrated circuit 710 is complemented with a subsequent integrated circuit 711 such as a DP that may include a graphics processor such as the Sandy Bridge™ type processors manufactured by Intel Corporation of Santa Clara, Calif. In an embodiment, the dual integrated circuit 711 includes embedded on-die memory 717 such as eDRAM. The dual integrated circuit 711 includes a dual processor 713 and a dual communications circuit 715 and dual on-die memory 717 such as SRAM.

In an embodiment, at least one passive device 780 is coupled to the RF integrated circuit 710 such that the integrated circuit 710 and the at least one passive device are part of the any apparatus embodiment that includes an RMI shielding structure that includes the integrated circuit 710 and optionally part of the integrated circuit 711.

In an embodiment, the electronic system 700 includes an antenna element 782 such as any PAA embodiment set forth in this disclosure. By use of the antenna element 782 such as any PAA embodiment set forth in this disclosure, a remote device 784 such as a television, may be operated remotely through a wireless link by an apparatus embodiment. For example, an application on a smart telephone that operates through a radio- and electromagnetic interference shielding structure broadcasts instructions through a wireless link to a television up to about 30 meters distant such as by Bluetooth® technology, but the RMI shielding structure embodiment protects GPS circuitry. The antenna element(s) 782 may also have an antenna for a GPS sector. The antenna element(s) 782 may also have an antenna for a cell phone. The antenna elements 782 may also have a monopole function. The antenna elements 782 may also have a dipole function. The antenna elements 782 may also have a PIFA function. The antenna elements 782 may also have a Vivaldi-type function. The antenna elements 782 may also have a solenoid-type function. Other antenna functions may be employed, where other useful functions are needed.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such an apparatus that includes a radio- and electromagnetic interference shielding structure according to any disclosed embodiment.

In an embodiment, the electronic system 700 also includes a display device 750, and an audio output 760. In an embodiment, the electronic system 700 includes an input device such as a controller 770 that may be a keyboard, mouse, touch pad, keypad, trackball, game controller, microphone, voice-recognition device, or any other input device that inputs information into the electronic system 700. In an embodiment, an input device 770 includes a camera. In an embodiment, an input device 770 includes a digital sound recorder. In an embodiment, an input device 770 includes a camera and a digital sound recorder.

A foundation substrate 790 may be part of the computing system 700. In an embodiment, the foundation substrate 790 is a motherboard that supports an apparatus that includes an RMI shielding structure mated to a subsequent die. It may be understood that a DCA board may be part of the computer system 700 as well as a motherboard onto which the DCA board is assembled. In an embodiment, the foundation substrate 790 is a board that supports an apparatus that includes an RF die with an RMI shielding structure mated to a PAA substrate. In an embodiment, the foundation substrate 790 incorporates at least one of the functionalities encompassed within the dashed line 790 and is a substrate such as the user shell of a wireless communicator.

As shown herein, the integrated circuit 710 can be implemented in a number of different embodiments, an apparatus that includes an RMI shielding structure according to any of the several disclosed embodiments and their equivalents, an electronic system, a computer system, one or more methods of fabricating an integrated circuit, and one or more methods of fabricating and assembling an apparatus that includes an RMI shielding structure according to any of the several disclosed embodiments as set forth herein in the various embodiments and their art-recognized equivalents. The elements, materials, geometries, dimensions, and sequence of operations can all be varied to suit particular I/O coupling requirements including an RMI shielding structure embodiments and their equivalents.

Although a die may refer to a processor chip, an RF chip, an RFIC chip, IPD chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus comprising:
a radio-frequency (RF) first die including several through-silicon vias (TSVs):
an active surface and a backside surface;
a plurality of sectors in the RF first die;
at least one TSV that transmits one of signal, power, and ground (signal TSV); and
at least one TSV shielded sector among the plurality of sectors, where the TSV shielded sector includes:
a shielding TSV enclosure of spaced-apart shielding TSVs that form a perimeter around at least a part of the TSV shielded sector; and
a lattice lid disposed on the die backside and matching the perimeter, wherein the at least one TSV shielded sector further includes:
a first plurality of shielding TSVs; and
a subsequent plurality of shielding TSVs that is concentric to the first plurality.

2. An apparatus comprising:
a radio-frequency (RF) first die including several through-silicon vias (TSVs):
an active surface and a backside surface;
a plurality of sectors in the RF first die;
at least one TSV that transmits one of signal, power, and ground (signal TSV); and
at least one TSV shielded sector among the plurality of sectors, where the TSV shielded sector includes:
a shielding TSV enclosure of spaced-apart shielding TSVs that form a perimeter around at least a part of the TSV shielded sector; and
a lattice lid disposed on the die backside and matching the perimeter, wherein the RF die active surface is coupled to a back-end metallization, and wherein the back-end metallization includes a through-metallization via (TMV) enclosure matching the shielding TSV perimeter.

3. An apparatus comprising:
a radio-frequency (RF) first die including several through-silicon vias (TSVs):
an active surface and a backside surface;
a plurality of sectors in the RF first die;
at least one TSV that transmits one of signal, power, and ground (signal TSV); and
at least one TSV shielded sector among the plurality of sectors, where the TSV shielded sector includes:
a shielding TSV enclosure of spaced-apart shielding TSVs that form a perimeter around at least a part of the TSV shielded sector; and
a lattice lid disposed on the die backside and matching the perimeter, further including a digital processor (DP) subsequent die coupled to the RF first die through the at least one signal TSV, disposed in the RF first die.

4. The apparatus of claim 3, further including:
wherein the DP subsequent die includes a ground ring that is disposed in back-end metallization of the DP subsequent die and that forms a perimeter around a sector in the DP subsequent die; and
a bump ring disposed between the DP die and the RF die backside, wherein the bump ring shares the same perimeter as the ground ring.

5. An apparatus comprising:
a radio-frequency (RF) first die including several through-silicon vias (TSVs):
an active surface and a backside surface;
a plurality of sectors in the RF first die;
at least one TSV that transmits one of signal, power, and ground (signal TSV); and
at least one TSV shielded sector among the plurality of sectors, where the TSV shielded sector includes:
a shielding TSV enclosure of spaced-apart shielding TSVs that form a perimeter around at least a part of the TSV shielded sector; and
a lattice lid disposed on the die backside and matching the perimeter, further including a phased-array antenna coupled to the RF die through at least one signal TSV.

6. An apparatus comprising:
a radio-frequency (RF) first die including several through-silicon vias (TSVs):
an active surface and a backside surface;
a plurality of sectors in the RF first die;
at least one TSV that transmits one of signal, power, and ground (signal TSV); and
at least one TSV shielded sector among the plurality of sectors, where the TSV shielded sector includes:
a shielding TSV enclosure of spaced-apart shielding TSVs that form a perimeter around at least a part of the TSV shielded sector; and
a lattice lid disposed on the die backside and matching the perimeter, further including:
a digital processor (DP) subsequent die coupled to the RF first die through the at least one signal TSV, disposed in the RF first die; and
a mounting substrate that is mated to the RF die at the active surface thereof.

7. The apparatus of claim 6, further including:
a phased-array antenna coupled to the RF die through at least one signal TSV.

8. An apparatus comprising:
a radio-frequency (RF) first die including several through-silicon vias (TSVs):
an active surface and a backside surface;
a plurality of sectors in the RF first die;
at least one TSV that transmits one of signal, power, and ground (signal TSV); and
at least one TSV shielded sector among the plurality of sectors, where the TSV shielded sector includes:
a shielding TSV enclosure of spaced-apart shielding TSVs that form a perimeter around at least a part of the TSV shielded sector; and
a lattice lid disposed on the die backside and matching the perimeter, further including:
wherein the RF die active surface is coupled to a back-end metallization, and wherein the back-end metallization includes a through-metallization via (TMV) enclosure matching the shielding TSV perimeter;
a digital processor (DP) subsequent die coupled to the RF first die through the at least one signal TSV, disposed in the RF first die, wherein the DP subsequent die includes a ground ring that is disposed in back-end metallization of the DP subsequent die and that forms a perimeter around a sector in the DP subsequent die;
a bump ring disposed between the DP die and the RF die backside, wherein the bump ring shares the same perimeter as the ground ring; and
a mounting substrate that is mated to the RF die at the active surface thereof.

9. An apparatus comprising:
a radio-frequency (RF) first die including several through-silicon vias (TSVs):
an active surface and a backside surface;
a plurality of sectors in the RF first die;
at least one TSV that transmits one of signal, power, and ground (signal TSV); and
at least one TSV shielded sector among the plurality of sectors, where the TSV shielded sector includes:
a shielding TSV enclosure of spaced-apart shielding TSVs that form a perimeter around at least a part of the TSV shielded sector; and
a lattice lid disposed on the die backside and matching the perimeter, wherein the at least one shielded sector contains global-positioning-system (GPS) circuitry in a first sector of the first die, the apparatus further including:
one of 2G, 3G or 4G circuitry in a second sector of the first die;
WiFi circuitry in a subsequent sector of the first die;
at least one first TSV disposed in the first sector;
at least one second signal TSV disposed in the second sector;
at least one subsequent signal TSV disposed in the subsequent sector; and
a digital processor (DP) subsequent die coupled to the RF first die through the at least one signal TSV.

10. The apparatus of claim 9, the apparatus further including:
a mounting substrate that is mated to the RF die at the active surface thereof.

11. The apparatus of claim 9, the apparatus further including:
a mounting substrate that is mated to the RF die at the active surface thereof; and
a phased-array antenna coupled to the RF die through at least one signal TSV.

* * * * *